United States Patent [19]

Chiba et al.

[11] Patent Number: 5,544,213
[45] Date of Patent: Aug. 6, 1996

[54] MASK HOLDING METHOD, MASK AND MASK CHUCK, EXPOSURE APPARATUS USING THE MASK AND THE MASK CHUCK, AND DEVICE PRODUCTION METHOD USING THE EXPOSURE APPARATUS

[75] Inventors: Yuji Chiba, Isehara; Shinichi Hara, Yokohama, both of Japan

[73] Assignee: Canon Kabushiki Kaisha, Tokyo, Japan

[21] Appl. No.: 343,961

[22] Filed: Nov. 17, 1994

[30] Foreign Application Priority Data

Nov. 30, 1993 [JP] Japan .................................. 5-299912

[51] Int. Cl.⁶ .................................................. G21K 5/00
[52] U.S. Cl. .............................. 378/34; 378/205; 378/208
[58] Field of Search ............................... 378/34, 35, 205, 378/208, 209; 250/491.1

[56] References Cited

U.S. PATENT DOCUMENTS

| 4,534,047 | 8/1985 | Deschenaux et al. | 378/35 |
| 4,610,020 | 9/1986 | La Fiandra | 378/35 |
| 5,026,239 | 6/1991 | Chiba et al. | 414/217 |
| 5,161,177 | 11/1992 | Chiba | 378/34 |
| 5,253,012 | 10/1993 | Chiba et al. | 355/53 |

*Primary Examiner*—Don Wong
*Attorney, Agent, or Firm*—Fitzpatrick, Cella, Harper & Scinto

[57] ABSTRACT

V-shaped linear groove portions are formed at regular intervals and at three positions (with 120° pitches) on a periphery, concentric with a ring-shaped support frame, of an X-ray mask to extend in the radial direction. On the other hand, corresponding mounts, as projecting portions, each having a spherical leading end are disposed at three positions on a mask chuck. The mask is held on the mask chuck at the three positions by engaging the corresponding V-shaped linear groove portions and the projecting portions.

15 Claims, 10 Drawing Sheets

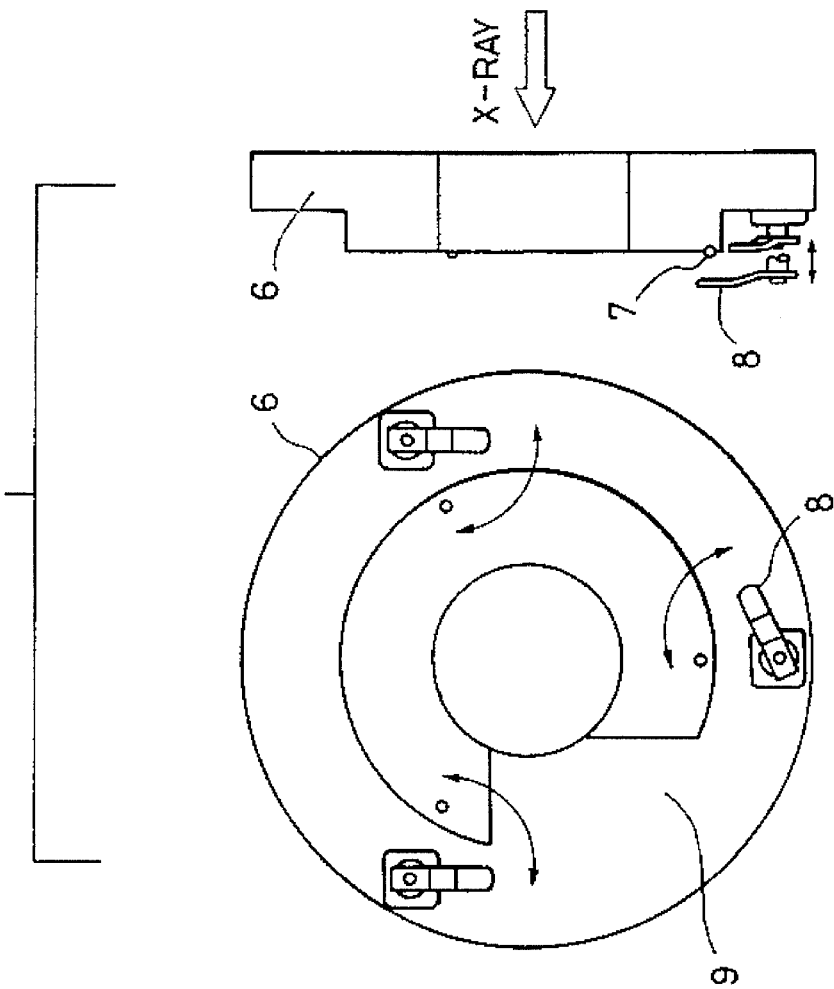
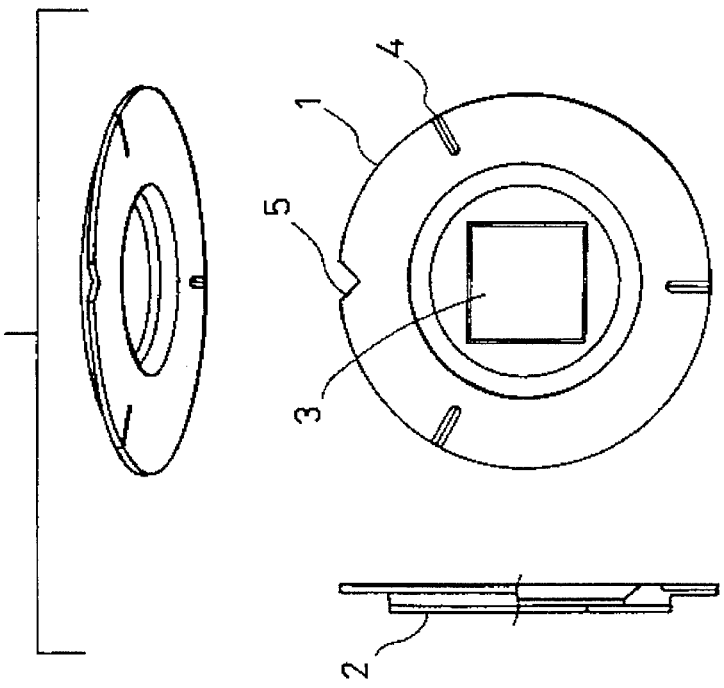

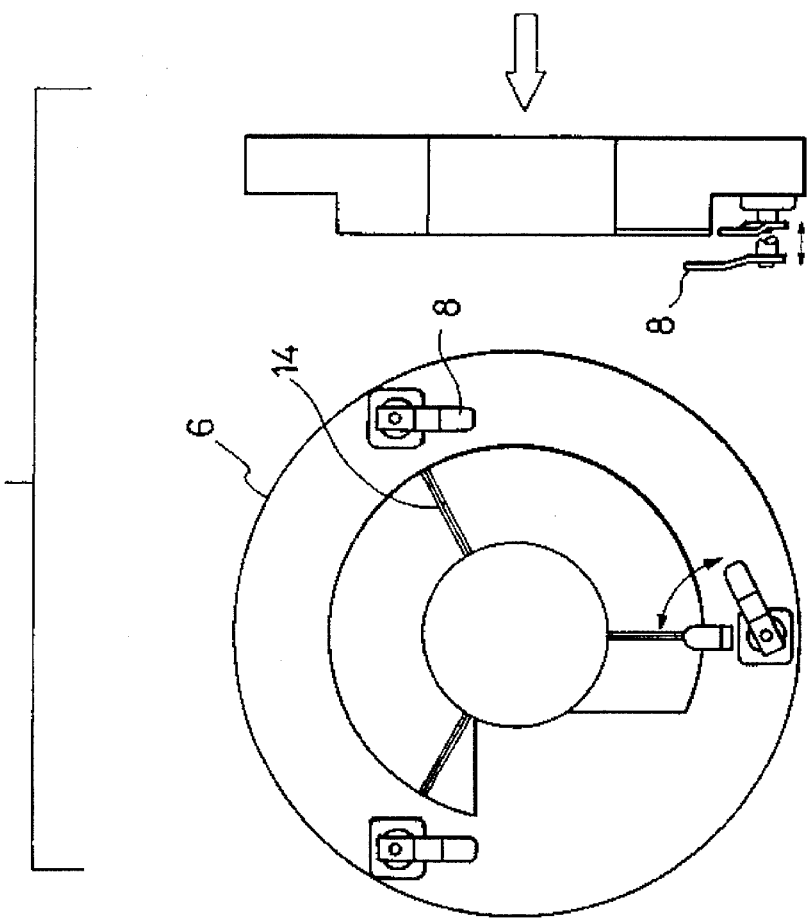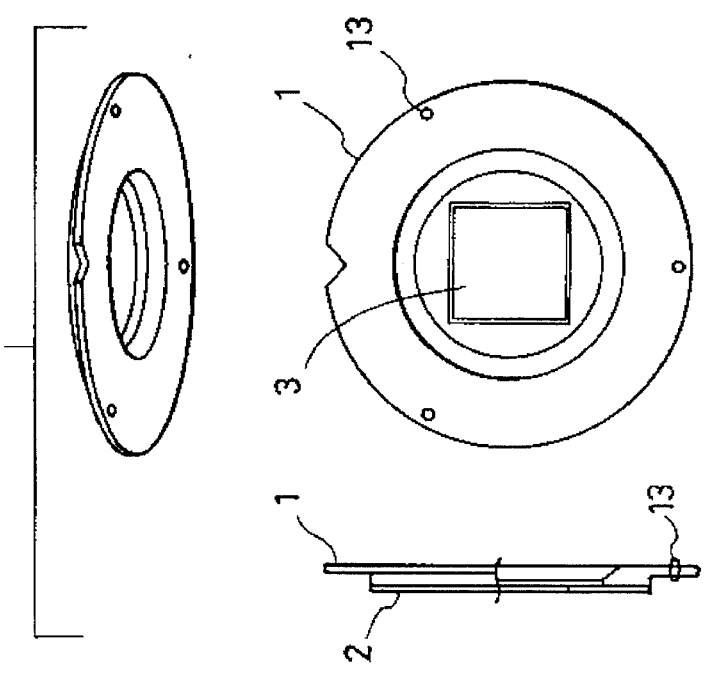

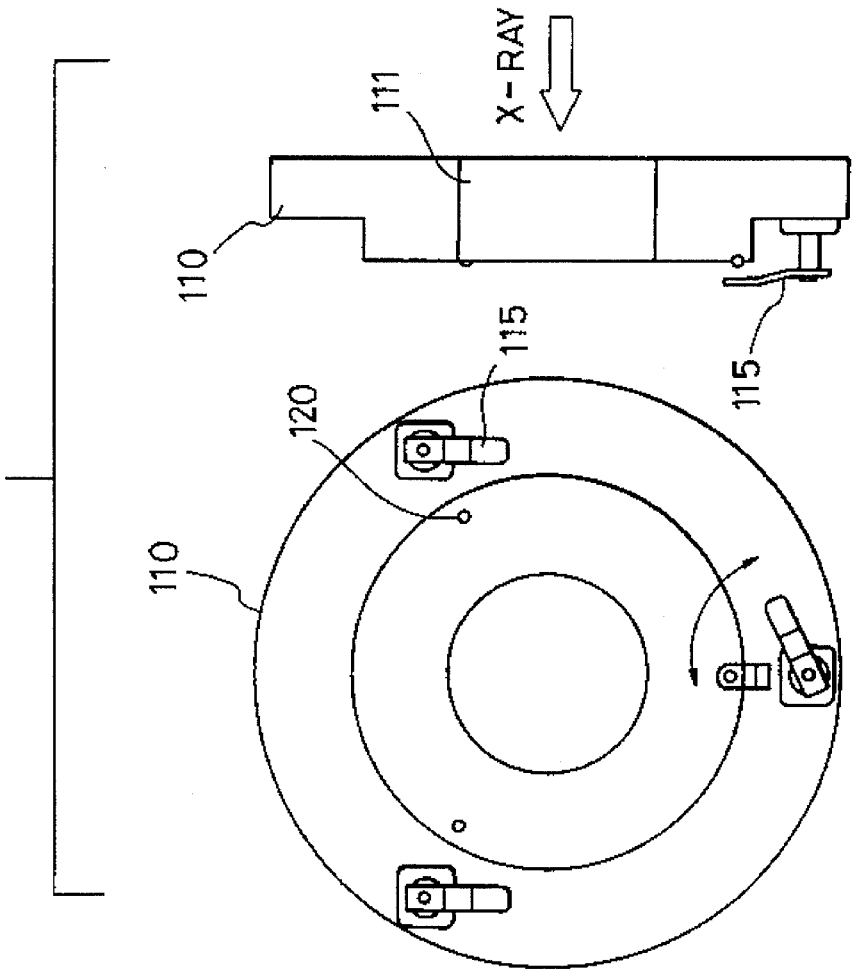
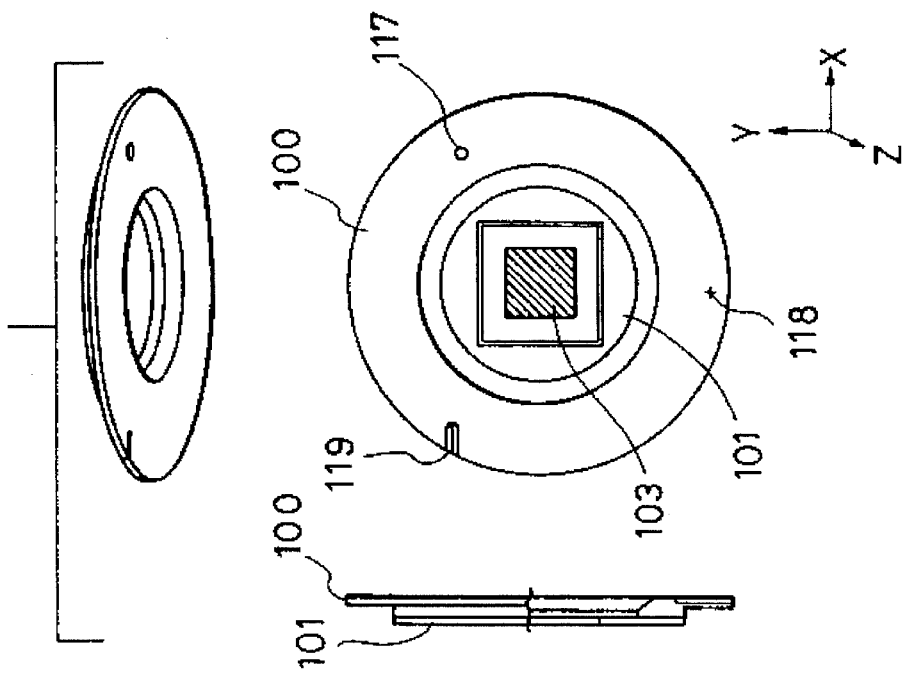

MASK HOLDING METHOD, MASK AND MASK CHUCK, EXPOSURE APPARATUS USING THE MASK AND THE MASK CHUCK, AND DEVICE PRODUCTION METHOD USING THE EXPOSURE APPARATUS

BACKGROUND OF THE INVENTION

1. Field of the Invention

The present invention relates to a method of holding a mask used in an exposure apparatus.

2. Description of the Related Art

The integration density of semiconductor integrated circuits has recently increased, and, in a semiconductor producing apparatus for producing such highly integrated circuits, printed wires have become finer with the increase in integration density, and therefore, higher exposure precision is required. In order to make the printed wires finer, it is effective to shorten the wavelength of a light source used for exposure. An X-ray exposure apparatus using X-rays having a shorter wavelength than that of ultraviolet rays, which are generally used, has been developed.

FIGS. 9(a) and 9(b) are schematic views showing an X-ray mask and a mask chuck mounted in a conventional X-ray exposure apparatus. FIG. 9(a) illustrates an X-ray mask which comprises a reinforcing mask frame 100, a mask substrate 101 made of silicon, an inorganic film (mask membrane) 102 formed by removing a portion of the mask substrate 101 by back etching, and a transfer pattern 103 of a semiconductor circuit and the like drawn on the mask membrane 102 by an electron beam (EB) drawing machine or the like. A magnetic ring 105 made of a magnetic material is embedded in the mask frame 100.

FIG. 9(b) illustrates a magnetically attractive mask chuck. A hole 111, through which exposure X-rays pass, is formed inside a ring-shaped chuck base 110. A magnetic unit 112 is circumferentially disposed corresponding to the magnetic ring 105, and generates a sufficient magnetic force to attract and hold the X-ray mask. These structures of the X-ray mask and the mask chuck allow the mask frame 100 of the X-ray mask to be magnetically attracted to and held in planar contact with a holding plane of the chuck base 110. It is noted that vacuum attraction may be used instead of the above magnetic attraction. When using vacuum attraction, the magnetic unit 112 is replaced with a vacuum port, and the mask frame 100 and the chuck base 110 are brought into planar contact with each other, and attracted by vacuum force.

However, since the mask frame 100 and the chuck base 110 are in planar contact with each other in these attractive holding methods, contact planes thereof are required to have a highly flat finish. If an attracted plane of the mask frame 100 has even a small amount of distortion, such as a warp, at the time when the transfer pattern is formed by the EB drawing machine during production of the mask, when the mask frame 100 is held by the chuck base 110 of the X-ray exposure apparatus, it is deformed by correcting its warp. There is a possibility that the stress resulting from the deformation will be transmitted to the transfer pattern 103 through the mask substrate 101 and the mask membrane 102, and the transfer pattern 103 will become more distorted than it is when being drawn. The thickness of the mask membrane 102 on which the transfer pattern 103 is formed is approximately 2 μm, and its rigidity is much smaller than those of the mask substrate 101 and the mask frame 100, each being a few millimeters in thickness. Therefore, distortion of the mask substrate 101 and the mask frame 100 has a great influence on the mask membrane 102, and also distorts the transfer pattern 103 badly. This problem is peculiar to a mask in which a transfer pattern is formed on an extra-thin mask membrane.

In order to solve the above problem, a method for preventing an X-ray mask from being deformed by a holding force when being held on a mask chuck, in other words, a method for holding the X-ray mask while keeping distortion of a mask frame caused in forming a transfer pattern (referred to as the "kinematic mount" hereinafter) has been suggested.

FIGS. 10(a) and 10(b) are views showing an example of a kinematic mount. FIG. 10(a) illustrates an X-ray mask for a kinematic mount. A conical (funnel-shaped) hole portion 117, a planar portion 118 and a V-groove portion 119 in which a cutting groove is linearly formed in the X direction in FIG. 10(a) are formed on a holding plane of a mask frame 100. FIG. 10(b) illustrates a mask chuck for a kinematic mount. Spherical projections 120 are disposed at three positions on a holding plane of a chuck base 110 to respectively engage with the conical hole portion 117, the planar portion 118 and the V-groove portion 119 of the mask. Furthermore, clamp mechanisms 115 for mechanically pressing and holding the mask are mounted at the three positions.

This structure brings the following holding state in which the mask equipped with six degrees of freedom is positioned without being overconstrained.

|  | Restrained | Free |
| --- | --- | --- |
| conical hole portion 117 | X, Y, Z | — |
| planar portion 118 | Z | X, Y |
| V-groove portion 119 | Y, Z | X |

According to the kinematic mount, since little external force for deforming the mask frame 100 acts on the mask frame 100 while the mask is held during exposure and the mask can be held (without distortion) in the same state as when the mask pattern is formed by the EB drawing machine, the mask pattern can be prevented from being distorted by deformation of the mask frame 100.

However, in the above kinematic mount, if the mask expands or shrinks with heat while being held by the mask chuck, since only the position of the conical hole portion 117 does not change and the planar portion 118 and the V-groove portion 119 are displaced relative to the conical hole portion 117 on an X–Y plane, positional changes owing to expansion and shrinkage cannot be relieved evenly. Therefore, the expansion and shrinkage of the mask frame have a great influence on pattern transfer accuracy.

Furthermore, since the three portions for supporting the mask are different in shape, it takes a significant amount of labor in manufacture and dimension control. In particular, the conical hole portion 117 requires a high precision in finishing and dimension control, and therefore, there is an overall problem in increased costs of mass-production.

SUMMARY OF THE INVENTION

The present invention aims to solve the above problems, and an object of the present invention is to provide a mask holding method capable of performing high-precision pattern transfer, and to provide a mask and a mask chuck at low cost.

Another object of the present invention is to provide an exposure apparatus and a device producing method of high precision using the mask and the mask chuck of the present invention.

To achieve these objects, the present invention, in a first aspect, provides a method of holding a mask on a mask chuck and includes steps of providing a mask in which V-groove portions are disposed at not less than three positions on a holding surface of the mask, providing a mask chuck in which projecting portions are disposed at not less than three positions on a holding plane of the mask chuck, aligning the V-groove portions of the mask with the projecting portions of the mask chuck and engaging the V-groove portions of the mask with corresponding projecting portions of the mask chuck to hold the mask on the mask chuck.

In another aspect, the present invention provides a method of holding a mask on a mask chuck, which includes steps of providing a mask in which projecting portions are disposed at not less than three positions on a holding surface of the mask, providing a mask chuck in which V-groove portions are provided at not less than three positions on a holding plane of the mask chuck, aligning the projecting portions of the mask with the V-groove portions of the mask chuck and engaging the projecting portions of the mask with corresponding V-groove portions of the mask chuck to hold the mask on the mask chuck.

In still another aspect, the present invention provides a mask that includes a transfer pattern, a mask support frame having a holding surface, the mask support frame comprising one of V-groove portions and projecting portions disposed at not less than three positions on the holding surface, wherein one of the V-groove portions and the projecting portions at the three positions on the mask support frame respectively engage with corresponding ones of projecting portions and V-groove portions, respectively, disposed at not less than three positions on a holding plane of a mask chuck when the mask is held on the mask chuck.

In still another aspect, the present invention provides a mask chuck for holding a mask, comprising a holding plane for holding the mask, means for attracting the mask to the holding plane and one of projecting portions and V-groove portions disposed at not less than three positions on the holding plane, wherein one of the projecting portions and the V-groove portions disposed at the three positions on the holding plane respectively engage with corresponding ones of V-groove portions and projecting portions, respectively, disposed at not less than three positions on the mask when the mask is held on the holding plane.

In yet another aspect, the present invention is directed to an exposure apparatus comprising a mask chuck for holding a mask, the mask chuck including a mask chuck holding plane having one of projecting portions and V-groove portions disposed at not less than three positions thereon, a mask including a mask holding plane having one of V-groove portions and projecting portions, respectively corresponding to the projecting portions and the V-groove portions of the mask chuck being disposed at not less than three positions on the mask holding plane, wherein corresponding portions of the mask chuck engage with those of the mask when the mask is held on the mask chuck and exposure means for transferring a pattern of the mask held on the mask chuck onto a wafer by exposure.

In the present invention, the mask can be an X-ray mask. Also, the positions on the holding surface of the mask can be equidistant, and the positions on the holding plane of the mask chuck can be equidistant.

Further objects, features and advantages of the present invention will become apparent from the following description of the preferred embodiments with reference to the attached drawings.

BRIEF DESCRIPTION OF THE DRAWINGS

FIGS. 1(a) and 1(b) are structural views showing a first embodiment of the present invention;

FIGS. 4(a) and 4(b) are structural views showing a second embodiment of the present invention;

FIGS. 10(a) and 10(b) are explanatory views of a conventional mask chuck of a kinematic mount type.

DESCRIPTION OF THE PREFERRED EMBODIMENTS

Embodiment 1

Figure 2A:
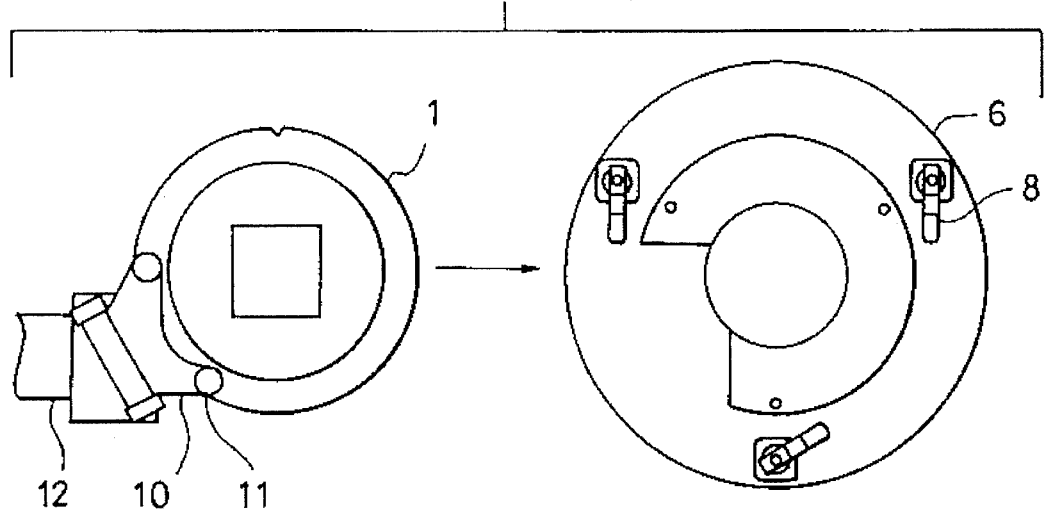
FIGS. 2(a) and 2(b) are views explaining a procedure for holding a mask on a mask chuck.

Preferred embodiments of the present invention will now be described. FIGS. 1(a) and 1(b) are structural views of a first embodiment. FIGS. 1(a) and 1(b) and 2(a) and 2(b) respectively show the structures of an X-ray mask and a mask chuck for holding the X-ray mask. A support frame 1 is shaped like a ring and provided with a rim, which is convenient to handle the mask during transportation, all around the outer periphery thereof. Although SiC is used as a material of the support frame 1 in this embodiment, other materials having a low coefficient of thermal expansion, for example, quartz glass, silicon, a ceramic material and the like, may be used. A silicon wafer 2 functioning as a mask substrate is adhesively fixed to the mask support frame 1, and its stiffness is provided by the mask support frame 1. The silicon wafer 2 may be fixed by anodic bonding or the like instead of adhesion. A mask membrane 3 made of a silicon nitride film is formed on the silicon wafer 2 by removing a portion of the silicon wafer 2, through which X-rays pass, by back etching. A transfer pattern such as a circuit pattern of a semiconductor device is drawn on the mask membrane 3 with an X-ray absorber of heavy metal, for example, gold. V-shaped linear grooves (referred to as "V-groove portions" hereinafter) 4 are formed to extend in the radial direction at three positions and at regular intervals (with 120° pitches) on a periphery concentric with the ring-shaped support frame 1. Although the V-groove portions have the same shape and dimensions, the lengths thereof may be different for convenience of working. A notch 5 formed on the outer periphery of the ring-shaped mask support frame 1 is used to roughly determine the position (direction) of the mask support frame 1. Therefore, the notch 5 may be a cutout like an orientation flat. The relative positional relationship between the V-groove portions 4 and the notch 5 is controlled with high precision.

FIG. 1(b) illustrates a mask chuck. Numerals 6 and 7 respectively denote a ring-shaped chuck base and projecting mounts. The mounts 7 are formed by embedding projecting members each having a spherical tip (rigid balls in this embodiment) at three positions on the chuck base 6. The mounts 7 are disposed at three positions to respectively engage with the V-groove portions formed on the mask support frame 1. When the X-ray mask is chucked, the V-groove portions 4 thereof respectively engage with the mounts 7 of the mask chuck. Clamp mechanisms 8 press the positioned X-ray mask against the mask chuck, and each of them is retreated by an actuator consisting of rotary and direct acting mechanisms to a position not to interfere with attachment and detachment of the X-ray mask. A cutout 9 formed on the chuck base 6 prevents interference between a transport unit 12 (FIGS. 2(a) and 2(b)) and the chuck base 6 when the X-ray mask is attached to and detached from the mask chuck. X-rays for exposure are radiated from the side opposite to the surface of the chuck base 6 on which the mounts 7 are formed.

The procedure for attaching the X-ray mask to and detaching the X-ray mask from the mask chuck will be described with reference to FIGS. 2(a) and 2(b). FIG. 2(a) shows a state in which the X-ray mask taken out from an unillustrated mask housing device is being gripped and transported by the transport unit 12 to be attached to the mask chuck. Numerals 10 and 11 respectively denote a mask hand and clampers mounted in two positions at ends of the mask hand 10 and driven by an unillustrated actuator.

It is better that the mask membrane 3 not lie under the clamp portion of the mask support frame 1 in order to prevent any dust, raised in contact portions of the clampers 11 and the mask support frame 1, from adhering onto the mask membrane 3 during transportation. On the other hand, the clamp mechanisms 8 of the mask chuck are retreated from the surface of the chuck base 6 in contact with the mask in preparation for attachment of the X-ray mask.

Figure 2B:
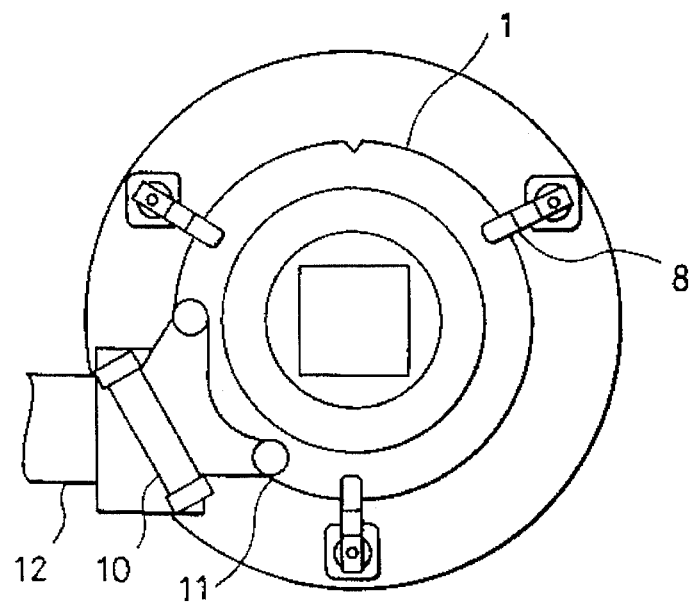

FIG. 2(b) shows a state in which the X-ray mask carried by the mask transport unit 12 is attached to the mask chuck. The spherical portions of the mounts 7 respectively engage with the V-groove portions 4 of the mask support frame 1 at three positions. After positioning of the X-ray mask is completed, the clamp mechanisms 8 move to predetermined positions on the mask support frame 1 to press the mask support frame 1 as shown in FIG. 2(b). After that, the clampers 11 release the mask support frame 1 and retreat. The X-ray mask held by the mask chuck is detached in reverse order to that above.

Figure 3:
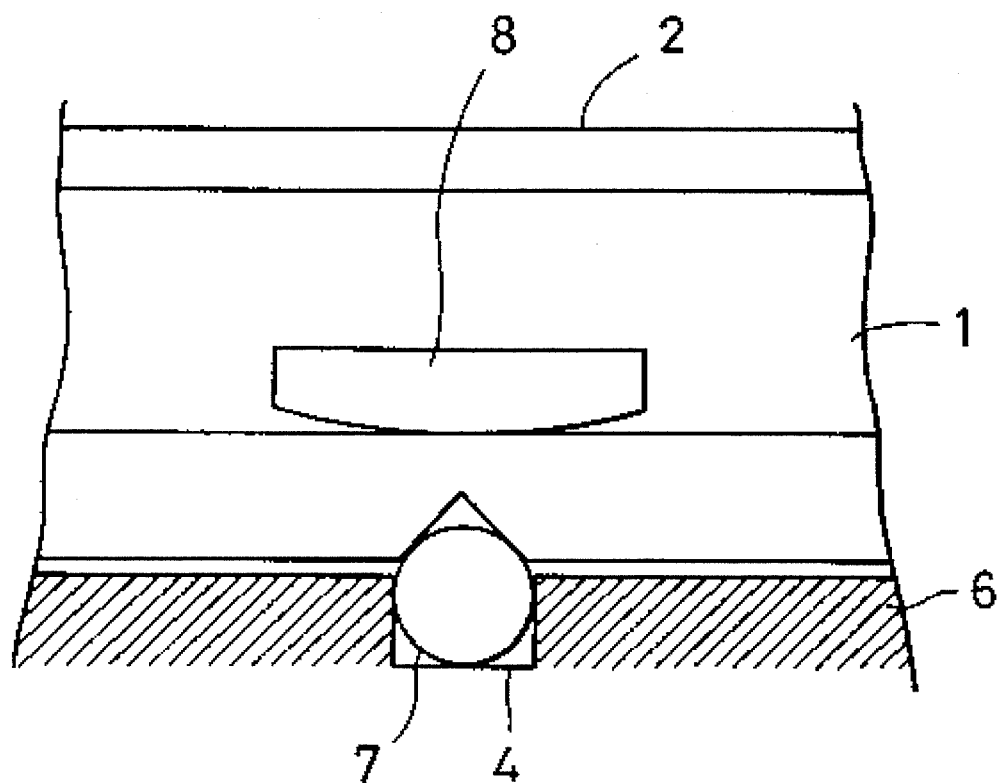
FIG. 3 is an enlarged view showing an engagement state of a V-groove portion and a projecting portion in the first embodiment.

FIG. 3 is an enlarged view of an engaging portion between the V-groove portion 4 and the mount 7. In this embodiment, a rigid ball is embedded in the chuck base as the mount 7, thereby controlling the projection height. When the V-groove portion 4 and the mount 7 engage, the lower surface of the mask support frame 1 is not in contact with the upper surface of the chuck base 6. It is desirable that the force of the clamp mechanism 8 act on the center of the mount 7 through the mask support frame 1. For that purpose, the lower portion of the clamp mechanism 8 is curved as illustrated. The force acting on the mask support frame 1 thereby makes it more difficult for distortion of the mask pattern to occur. A preferable material of the clamp mechanism 8 is a non-metal, for example, resin in order to minimize the generation of dust.

In a variation of the above embodiment, the V-groove portions 4 are disposed at four positions and at regular intervals with 90° pitches on the periphery of the mask support frame 1 and the mounts 7 are disposed at four positions with 90° pitches on the chuck base 6. It is thereby possible to bake the drawn pattern, whose phase is changed by 90° and 180° in exposure, using the same X-ray mask. Furthermore, it is easy to bake, for example, a vernier used to evaluate a wafer stage and an alignment system of an X-ray exposure apparatus.

This embodiment has the following advantages:

1) Even if the mask support frame has a slight warp or the like in a natural state, since the mask can be held by the mask chuck while maintaining that state, the transfer pattern on the mask membrane is not distorted and a good pattern transfer precision can be obtained.

2) The three points where the X-ray mask and the mask chuck are in contact with each other are disposed at regular intervals and have the same structure. Therefore, even if the mask support frame expands or contracts with heat change and the like, it is possible to let the expansion or contraction be relieved evenly in the three portions along the V-groove portions, and to restrict the influence of the expansion or contraction on the pattern transfer precision.

3) Manufacture and inspection costs can be reduced only by forming simply shaped V-groove portions on the mask support frame of the X-ray mask or the chuck plane of the mask chuck.

Embodiment 2

A second embodiment of the present invention will now be described. In FIGS. 4(a) and 4(b), the same numerals as those in the above embodiment denote the same components. FIG. 4(a) and 4(b) respectively illustrate the structures of an X-ray mask and a mask chuck in the second embodiment. The relationship between the V-groove portions and pins in this embodiment is opposite to the relationship between the V-groove portions and the mounts in the embodiment discussed above.

Positioning pins 13 are disposed at three positions with 120° pitches on a mask support frame 1, and both ends thereof project from both sides of a rim of the mask support frame 1. The projecting ends of the pins 13 are spherically shaped, and a material generating little dust (e.g., sapphire) is selected as the material of the pins 13.

FIG. 4(b) illustrates a wafer chuck. V-groove portions 14 having the same shape as those in the above embodiment are formed at three positions with 120° pitches, and respectively engage with the pins 13.

Figure 5:
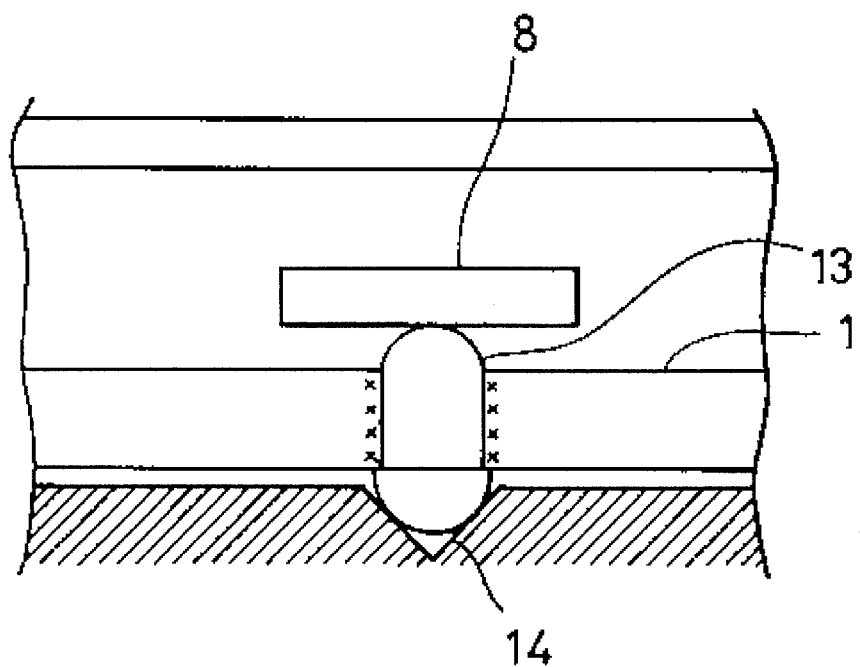
FIG. 5 is an enlarged view showing an engagement state of a V-groove portion and a projecting portion in the second embodiment.

FIG. 5 is an enlarged view of an engaging portion between the pin 13 and the V-groove portion 14. The pin 13 and the V-groove portion 14 are engaged and positioned in contact with each other at two points. Since a clamp mechanism 8 is nearly in point contact with the pin 13, a preferable material thereof is a relatively soft material, such as resin, so that an impression on the clamp mechanism 8 formed by the pin 13 functions as a seat for the pin 13. This is the same if projecting members are mounted on opposed surfaces in the engaging portions between the mask support frame 1 and the mounts 7 in the first embodiment. Since the operation procedure of the second embodiment is the same as that of the first embodiment, explanation thereof is omitted.

According to this embodiment, since the mask support frame 1 is not directly in contact with the chuck base 6, but through the pins 13, it is possible to select a material in consideration of the dust raised when the X-ray mask is attached. Furthermore, since it is only necessary to apply drilling to the mask support frame 1 and fix the pins 13 into holes by adhesion, quality control is easy to implement. In particular, when a material, which is difficult to work, like SiC, is used as a material of the mask support frame 1, productivity is greatly enhanced from the viewpoint of manufacturing costs and yields.

Embodiment 3

Figure 6:
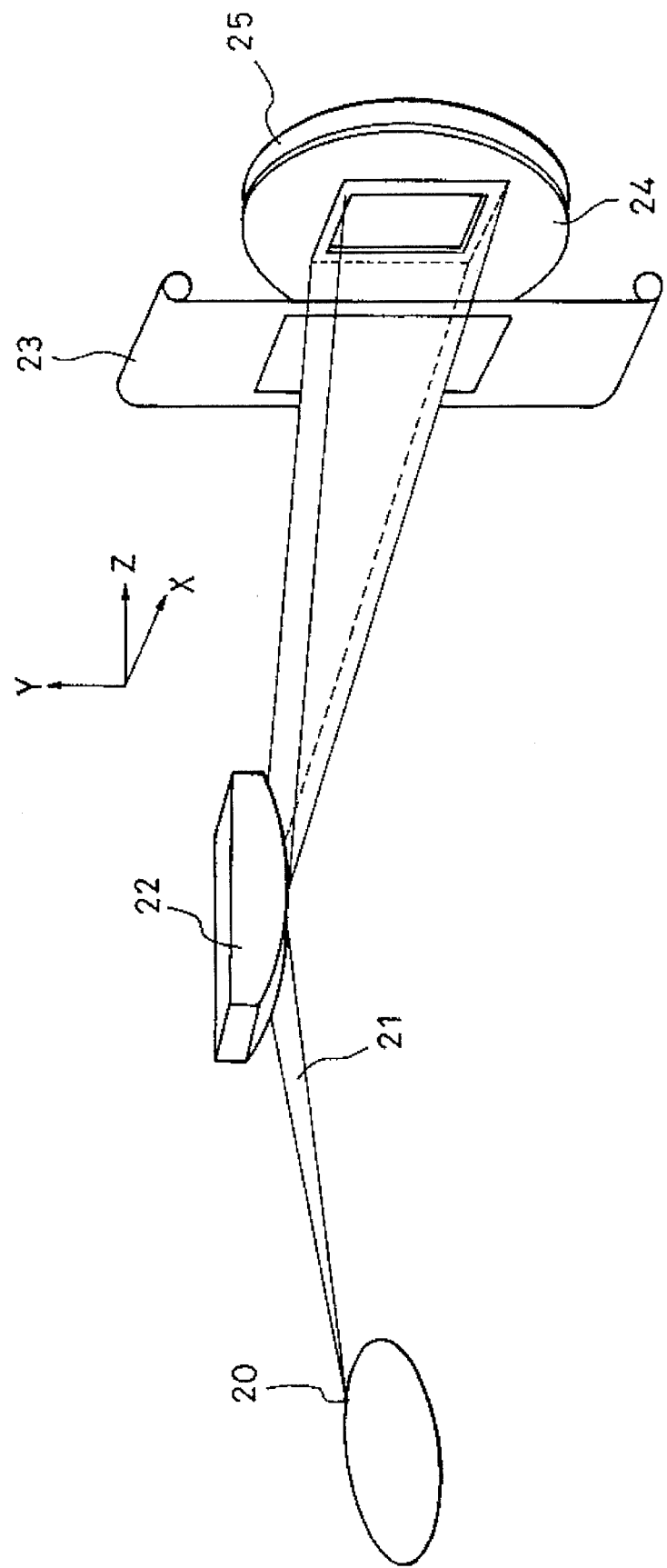
FIG. 6 is a general view showing an embodiment of an X-ray exposure apparatus.

An embodiment of an exposure apparatus for producing a micro device (e.g., a semiconductor device, a thin-film magnetic head, a micromachine and the like) using the above-mentioned masks and mask chucks will now be described. FIG. 6 shows the structure of an X-ray exposure apparatus in this embodiment. Referring to FIG. 6, synchrotron orbital radiation 21 in the shape of a sheet beam radiated from an SOR source 20 is enlarged by a convex mirror 22 in the direction perpendicular to an orbital plane of the radiation 21. The radiation 21 reflected and enlarged by the convex mirror 22 is controlled by a shutter 23 so that the exposure amount in the radiation region is uniform, and led to an X-ray mask 24 through the shutter 23. The X-ray mask 24 is held by an unillustrated mask chuck in the above-mentioned mount method. An exposure pattern formed on the X-ray mask 24 is exposed and transferred onto a wafer 25 by a step and repeat method, a scanning method or the like.

Figure 7:
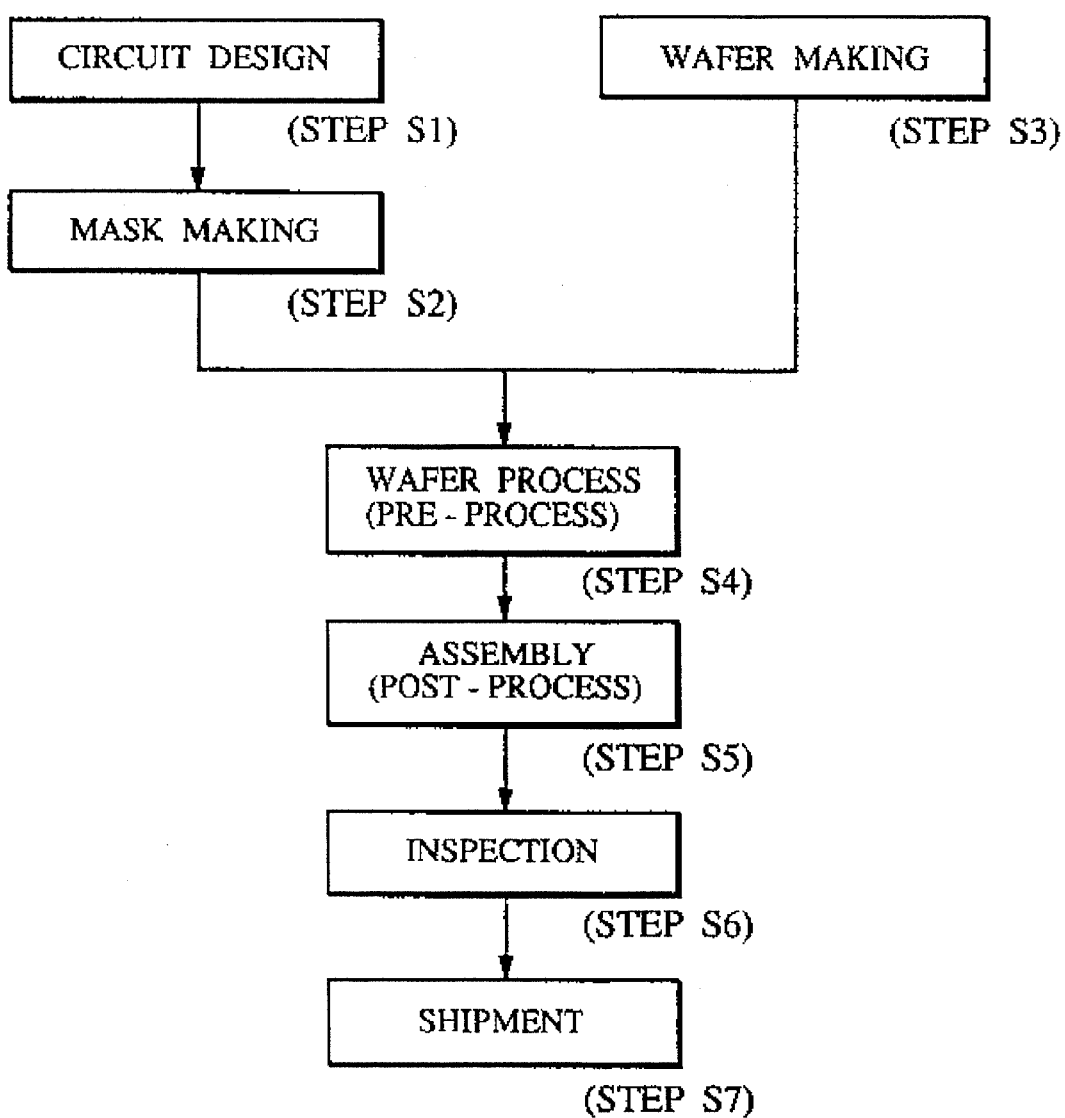
FIG. 7 is a flow chart explaining a device production method.

A device production method using the above exposure apparatus will now be described. FIG. 7 is a flow chart showing the procedure for producing a micro device (e.g., a semiconductor chip such as an IC, an LSI, a liquid crystal panel, a CCD, a thin-film magnetic head, and a micromachine). A circuit of a semiconductor device is designed in Step S1 (circuit design). A mask on which a pattern of the designed circuit is formed is made in Step S2 (mask making). On the other hand, a wafer is made by using a material, such as silicon, in Step S3 (wafer making). In Step S4 (wafer process), referred to as a pre-process, an actual circuit is formed on the wafer using lithography technology by using the prepared mask and wafer. The next Step S5 (assembly), referred to as a post-process, produces a semiconductor chip by using the wafer made in Step S4, and includes an assembly step (dicing and bonding), a packaging step (chip encapsulation), and the like. In Step S6 (inspection), a performance test and a durability test are carried out on the semiconductor device made in Step S5. The semiconductor device is completed through the above steps and shipped in Step S7.

Figure 8:
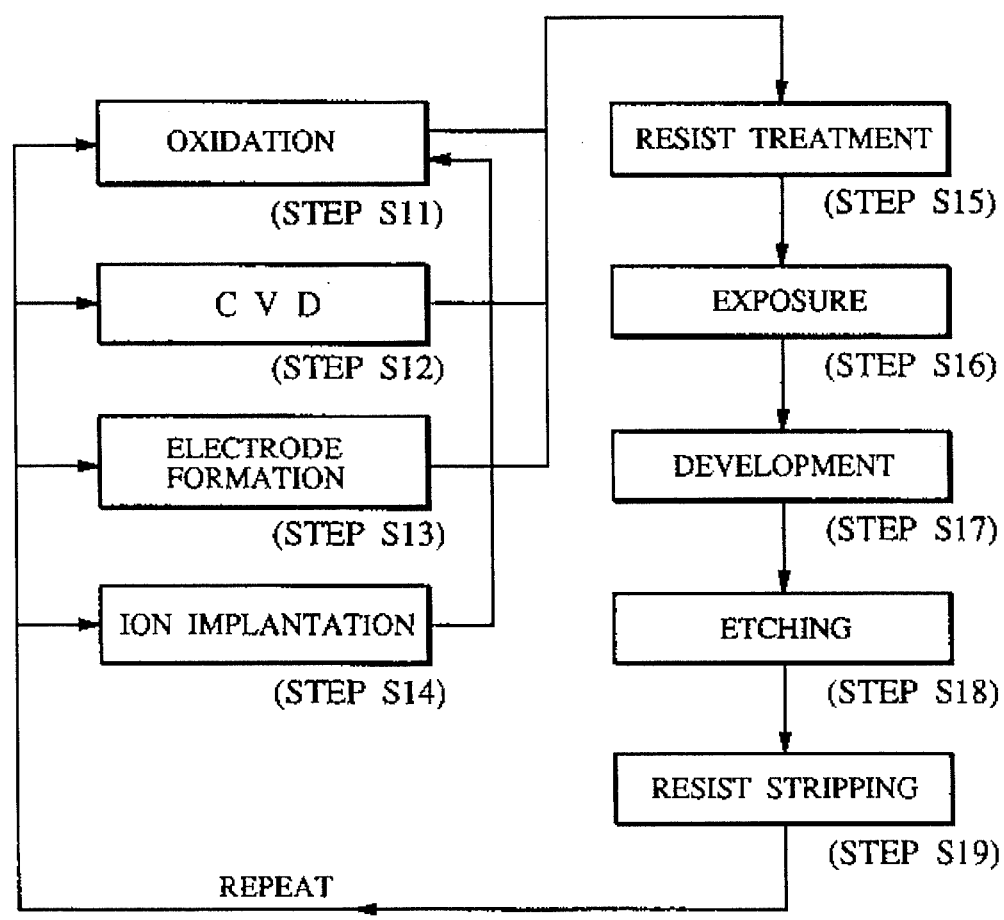
FIG. 8 is a detailed flow chart of a wafer process.
Figure 9B:
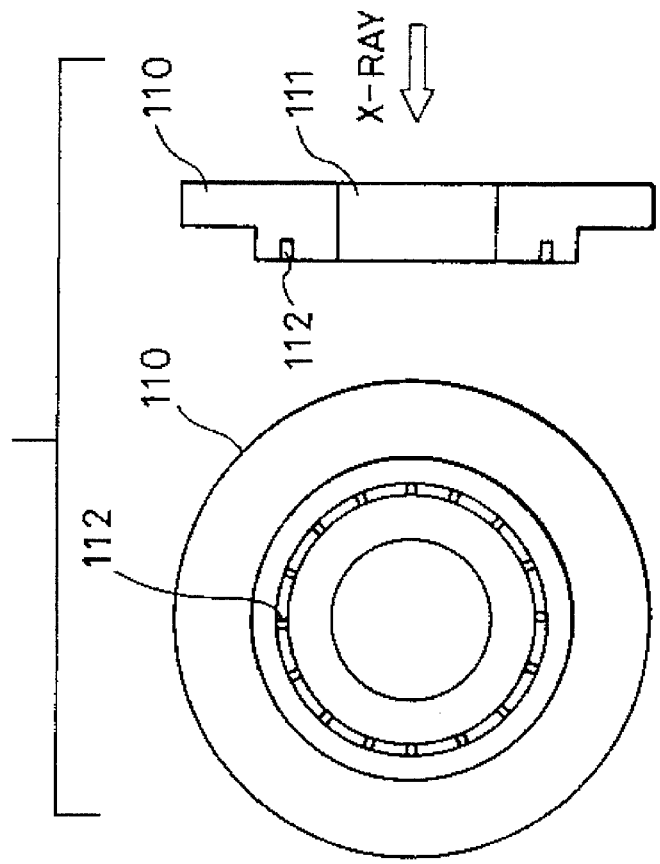
FIGS. 9(a) and 9(b) are explanatory views of a conventional magnetically attractive mask chuck.
Figure 9A:
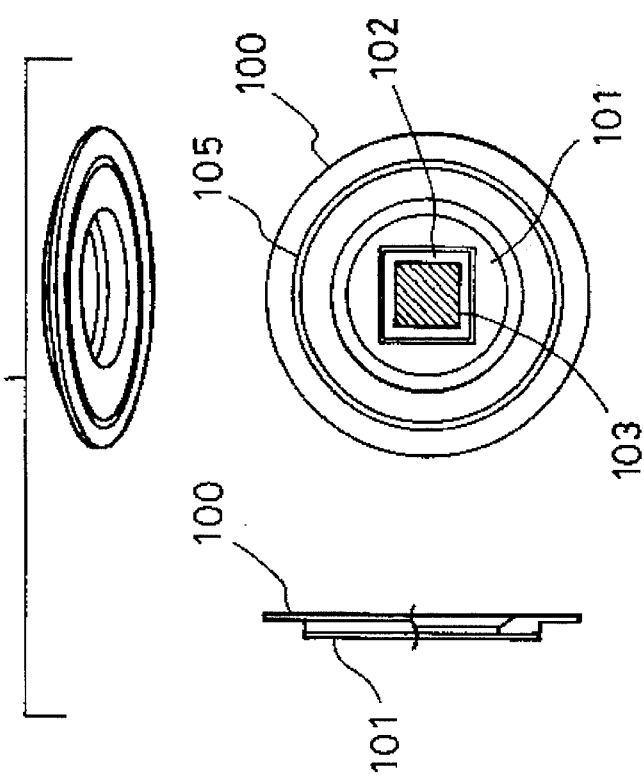

FIG. 8 is a flow chart showing the above-mentioned wafer process in detail. The surface of the wafer is oxidized in Step S11 (oxidation), and an insulating film is formed on the surface of the wafer in Step S12 (CVD). An electrode is formed on the wafer by evaporation in Step S13 (electrode formation). Ions are implanted into the wafer in Step S14 (ion implantation). A sensitive material is applied on the wafer in Step S15 (resist process). The circuit pattern of the mask is baked on the wafer by exposure of the above-mentioned exposure apparatus in Step S16 (exposure). The exposed wafer is developed in Step S17 (development). Parts other than the developed resist image are cut off in Step S18 (etching). The resist which is unnecessary after etching is removed in Step S19 (resist stripping). The repetition of these steps forms circuit patterns on the wafer one on another.

The use of the method in this embodiment makes it possible to produce a highly-integrated semiconductor device which has been previously difficult to produce.

While the present invention has been described with reference to what are presently considered to be the preferred embodiments, it is to be understood that the invention is not limited to the disclosed embodiments. To the contrary, the invention is intended to cover various modifications and equivalent arrangements included within the spirit and scope of the appended claims.

What is claimed is:

1. A method of holding a mask on a mask, chuck, said method comprising:

providing a mask in which V-shaped linear groove portions are disposed at not less than three positions on a holding surface of the mask;

providing a mask chuck in which projecting portions are disposed at not less than three positions on a holding plane of the mask chuck;

aligning the V-shaped linear groove portions of the mask with the projecting portions of the mask chuck; and engaging the V-shaped linear groove portions of the mask with corresponding projecting portions of the mask chuck to hold the mask on the mask chuck.

2. A mask holding method according to claim 1, wherein the mask is an X-ray mask.

3. A mask holding method according to claim 1, wherein the positions on the holding surface of the mask are equidistant and the positions on the holding plane of the mask chuck are equidistant.

4. A method of holding a mask on a mask chuck, said method comprising:

providing a mask in which projecting portions are disposed at not less than three positions on a holding surface of the mask;

providing a mask chuck in which V-shaped linear groove portions are disposed at not less than three positions on a holding plane of the mask chuck;

aligning the projecting portions of the mask with the V-shaped linear groove portions of the mask chuck; and engaging the projecting portions of the mask with corresponding V-shaped linear groove portions of the mask chuck to hold the mask on the mask chuck.

5. A mask holding method according to claim 4, wherein the mask is an X-ray mask.

6. A mask holding method according to claim 4, wherein the positions on the holding surface of the mask are equidistant and the positions on the holding plane of the mask chuck are equidistant.

7. A mask, comprising:

a transfer pattern; and a mask support frame having a holding surface, said mask support frame comprising one of V-shaped linear groove portions and projecting portions disposed at not less than three positions on the holding surface, wherein one of the V-shaped linear groove portions and the projecting portions at the three positions on said mask support frame respectively engage with corresponding ones of projecting portions and V-shaped linear groove portions, respectively, disposed at not less than three positions on a holding plane of a mask chuck when said mask is held on the mask chuck.

8. A mask according to claim 7, wherein said mask is an X-ray mask.

9. A mask according to claim 7, wherein the positions on the holding surface of the mask are equidistant and the positions on the holding plane of the mask chuck are equidistant.

10. A mask chuck for holding a mask, comprising:

a holding plane for holding the mask;

means for attracting the mask to said holding plane; and one of projecting portions and V-shaped linear groove portions disposed at not less than three positions on said holding plane, wherein one of the projecting portions and the V-shaped linear groove portions disposed at the three positions on said holding plane respectively engage with corresponding ones of V-shaped linear groove portions and projecting portions, respectively, disposed at not less than three positions on the mask when the mask is held on said holding plane.

11. A mask chuck according to claim 10, wherein the mask is an X-ray mask.

12. A mask chuck according to claim 10, wherein the positions on the holding surface of the mask are equidistant and the positions on the holding plane of the mask chuck are equidistant.

13. An exposure apparatus, comprising:

a mask chuck for holding a mask, said mask chuck including a mask chuck holding plane having one of projecting portions and V-shaped linear groove portions disposed at not less than three positions thereon;

a mask including a mask holding plane having one of V-shaped linear groove portions and projecting portions, respectively corresponding to the projecting portions and the V-shaped linear groove portions of said mask chuck being disposed at not less than three positions on the mask holding plane, wherein corresponding portions of said mask chuck engage with those of said mask when said mask is held on said mask chuck; and exposure means for transferring a pattern of said mask held on said mask chuck onto a wafer by exposure.

14. An exposure apparatus according to claim 13, wherein said exposure means performs exposure transfer by using X-rays.

15. An exposure apparatus according to claim 13, wherein the positions on the holding surface of the mask are equidistant and the positions on the holding plane of the mask chuck are equidistant.

* * * * *

UNITED STATES PATENT AND TRADEMARK OFFICE
CERTIFICATE OF CORRECTION

PATENT NO. : 5,544,213
DATED : August 6, 1996
INVENTOR(S) : YUJI CHIBA, ET AL.

It is certified that error appears in the above-indentified patent and that said Letters Patent is hereby corrected as shown below:

COLUMN 8:

Line 11, "mask, chuck" should read --mask chuck,--.

Signed and Sealed this

Seventh Day of January, 1997

BRUCE LEHMAN

*Attest:*

*Attesting Officer*  *Commissioner of Patents and Trademarks*